United States Patent [19]
Schmitz et al.

[11] Patent Number: 5,387,289
[45] Date of Patent: Feb. 7, 1995

[54] FILM UNIFORMITY BY SELECTIVE PRESSURE GRADIENT CONTROL

[75] Inventors: Johannes J. Schmitz, Sunnyvale; Raymond L. Chow, Cupertino; Sien G. Kang, Tracy; Edward J. Rode, San Ramon; Frank O. Uher, Los Altos, all of Calif.

[73] Assignee: Genus, Inc., Sunnyvale, Calif.

[21] Appl. No.: 950,088

[22] Filed: Sep. 22, 1992

[51] Int. Cl.⁶ .............................. C23C 16/00
[52] U.S. Cl. ........................ 118/725; 118/715; 156/345
[58] Field of Search ............ 118/715, 719, 725; 156/345

[56] References Cited

U.S. PATENT DOCUMENTS

| | | | |
|---|---|---|---|
| 3,854,443 | 12/1974 | Baerg | 118/730 |
| 4,993,358 | 2/1991 | Mahawilli | 118/715 |
| 5,000,113 | 3/1991 | Wang | 118/729 |
| 5,133,284 | 7/1992 | Thomas | 118/725 |
| 5,230,741 | 7/1993 | van de Ven | 118/728 |

FOREIGN PATENT DOCUMENTS

| | | |
|---|---|---|
| 3633386 | 4/1988 | Germany . |
| 63-53932 | 3/1988 | Japan . |
| 1-223724 | 9/1989 | Japan . |
| 3-281780 | 12/1991 | Japan . |

*Primary Examiner*—Richard Bueker
*Attorney, Agent, or Firm*—Donald R. Boys

[57] ABSTRACT

A system for depositing a film on a substrate in a CVD process has a second-source injection sub-system for injecting a control gas. The deposition rate of the material deposited in the CVD process is a function of the concentration of the control gas at the point that material is deposited. The second source injection sub-system provides a concentration gradient of the control gas relative to the substrate surface coated, and alters the thickness uniformity of the film. By controlling the gradient one may control the thickness uniformity profile. In another embodiment, the invention applies to dry etching with reactive gas, and the etching rate is controlled by second source provision of a control gas.

9 Claims, 8 Drawing Sheets

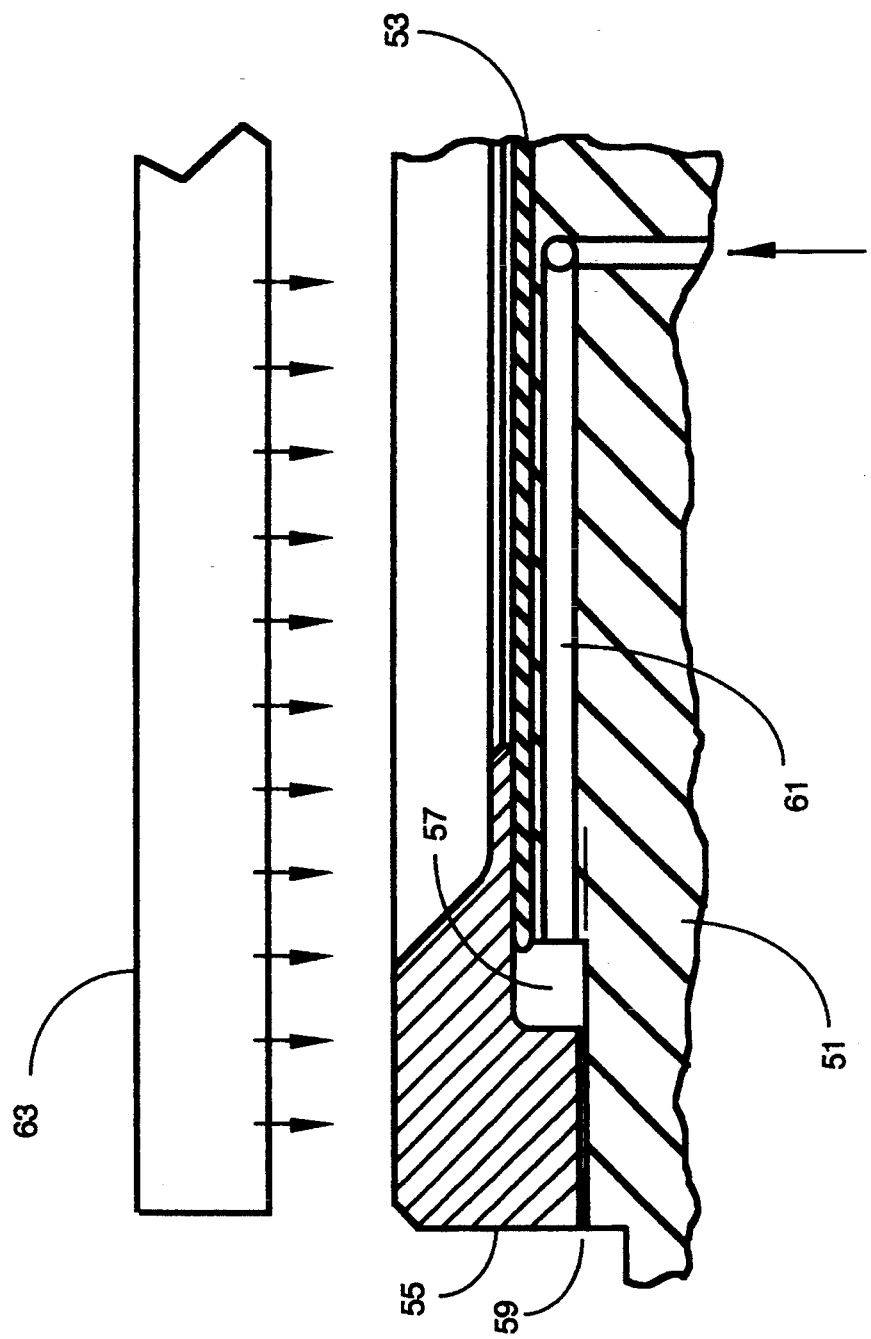

FILM UNIFORMITY BY SELECTIVE PRESSURE GRADIENT CONTROL

FIELD OF THE INVENTION

The present invention is in the area of apparatus for accomplishing processes on wafers as a manufacturing step in producing integrated circuits, and relates in particular to apparatus and methods for providing coating and etching uniformity.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. CVD is a well known process for depositing such thin films and layers. For example, polysilicon may be deposited from silane gas, $SiH_4$. It is known, too, to deposit tungsten silicide from a mixture of gases including silane and a tungsten-bearing gas such as tungsten hexaflouride. Pure tungsten is also deposited on silicon wafers in the manufacture of integrated circuits, sometimes selectively and sometimes across the entire surface in a process known as "blanket" tungsten.

In a typical CVD process such as blanket tungsten, wafers are placed on supports within a sealable chamber, the chamber is sealed and evacuated, the wafers are heated, typically by heating the wafer support, and a gas mixture is introduced into the chamber. For example, in the blanket tungsten process, tungsten hexaflouride and hydrogen are introduced as reactive gases, and typically argon is introduced as a non-reactive carrier gas. The tungsten hexaflouride is the source of deposited tungsten. Typically the gases are flowed continuously during process. The temperature of a substrate (wafer) to be coated is one of the variables that drives the chemical reaction to cause tungsten to be deposited on the substrate surface. It is important to control the temperature, the concentration of various gases in the mixture introduced, and such characteristics as the uniformity of flow of gas over the surface being coated, among other variables.

An even thickness of a deposited layer is an important characteristic in CVD coating. One reason is that the process of making integrated circuits is generally a process of adding a layer of material and then removing portions of the added layer to provide structure on the wafer surface. Removal of portions of a layer is most often done by etching, which is a process of eroding material from the surface of a layer, usually in a specific pattern. It may be necessary, for example, to etch vias through an insulating layer to be able to subsequently provide electrical connection to structure beneath the insulating layer. If the insulating layer is not of uniform thickness, etching at a specific rate in one region on the wafer will open a via through the insulating layer before the same etch rate will accomplish the via in a region on the wafer where the insulating layer is thicker. There is no good way, though, to stop etching in the one region while continuing in another, so to finish the vias in the thicker regions will over-etch in the thinner regions, possibly damaging underlying structure in the thinner regions.

Another example of the importance of coating thickness uniformity is in the deposition of electrically conductive layers subsequently etched to provide electrically conductive interconnections between devices in an integrated circuit. If the coating thickness is not uniform, the cross section of the resulting interconnecting traces will vary, and the electrical conductivity of the traces will vary accordingly.

Wafer uniformity is typically measured and reported in percentages. A thickness uniformity of plus or minus 2% is a typical goal in CVD coating.

Much effort and expense is expended in CVD equipment design to promote thickness uniformity. For example, manifolding is provided to inject the mixture of coating gases into a chamber in a CVD process in a manner to promote uniformity, such as by injecting the coating gas mixture individually through a distribution apparatus at or near the surface of a wafer to be coated. It is known to the inventors, for example, to distribute the coating gas mixture through a "showerhead" device, which uses a perforated plate generally parallel to the surface of a wafer to be coated, and passes the gas mixture through holes in the plate arranged to provide the empirically "best" distribution, as measured by thickness measurement instruments after processing.

It has been found in practice that for gas distribution devices to work well, and to provide process stability and repeatability, it is typically very important that gases be thoroughly mixed before being introduced into the processing chamber. Even with such efforts and precautions, however, adequate uniformity is not always achieved. For example, it is commonly known and expected in the industry that thickness uniformity "drops off" near the outer periphery of a wafer. Virtually all profiles produced across a wafer diameter show this thickness degradation of the solid deposited film at the wafer's edge. There are various explanations in the art for the phenomenon, and many simulations have been done based on fluid dynamics theory that show the effect, as well as empirical studies.

The matter of gas composition and concentration at the point of process is no simple matter, because gases must be introduced at discrete points, and coating gas is "used up" at the point of process. Moreover, most CVD processes are performed at relatively low pressures. A total pressure in a process of chamber of less that 1 Torr is common, although some processes are now performed at pressures up to 30 Torr and higher.

CVD processing for such as semiconductor fabrication has been developed over a number of years, and there are many useful processes. In some simple processes, a single source gas, a source gas being a gas that contributes to the solid film formed, is decomposed by heat causing a material to deposit on a substrate, leaving gaseous products that are conducted away from the substrate. In such processes a carrier gas that does not participate in the chemical reaction is frequently used to help conduct the coating gas to the substrate.

In other processes, more than one gas introduced into the CVD chamber participates in a chemical reaction. In these instances, one gas may contribute all of the material that forms the solid coating, or a more complex coating may be formed by material contributed by more than one gas. An example of a process having more than one reactive gas in which both contribute to the coating is in the production of amorphous silicon nitride. In this process $SiH_4$ and $NH_3$ react to produce an amorphous solid film of silicon nitride generally represented by $Si_3N_4$, and other products, notably hydrogen.

An example of a process in which there are two reactive gases, and one contributes all of the material for the solid film, is the reduction of tungsten hexaflouride by hydrogen to produce a tungsten or tungsten silicide film. Another is the reduction of tungsten hexaflouride by silane to produce a film.

Conventionally, as described in the background section above, all of the gases involved in a reaction are mixed prior to injection to the CVD chamber, and the proportions are controlled by careful measurement of flow through precision mass flow controllers. The precise proportions required are typically determined empirically, and are influenced greatly by the nature of the coating equipment. It is conventional wisdom also, to provide for uniform distribution of the coating gas mixture over a surface to be coated, and to provide for rapid replacement of depleted source gas at the point of process, that is, at the surface being coated. Even with the precautions described above, further improvement in thickness uniformity is always welcome, and provides monetary benefits in processing.

In addition to the problems that stem from uneven coating thickness, further problems may result from uneven etch rate in subsequent steps to pattern deposited film. An etch process that is not uniform over a wafer surface can have the same undesirable effect as a uniform etch on a non-uniform film. Moreover, problems can be further magnified if the film is non-uniform and the etch rate is also non-uniform.

What is needed is a greater degree of control over uniformity of coating and uniformity of etch rate, with an ability to alter uniformity profiles in a selective and controlled manner.

SUMMARY OF THE INVENTION

In an embodiment of the invention a system for providing a film of a material on a substrate by a CVD process performed in a CVD chamber has a support within the chamber for supporting the substrate during processing and a heater associated with the support for heating the substrate to facilitate the deposition of the material. Coating gas having at least one substance reactive to produce the material of the film is injected into the CVD chamber, and a control gas is provided in the chamber in a manner to provide a concentration gradient proximate and parallel to the surface to be coated. The deposition rate of the material to form the film is a function of concentration of the control gas at the point of process on the substrate.

In embodiments of the invention the provision of control gas is positioned and the rate of provision controlled to provide a concentration gradient relative to the surface of the substrate to be coated. The concentration gradient provides alteration of the thickness uniformity of the film deposited on the wafer. In one embodiment the control gas is injected at a central point relative to substrate supports and at the inlet to a vacuum pumping system. In another, control gas is injected from a manifold surrounding a substrate on a support. In yet another embodiment, control gas is substituted for a portion of a purge gas injected around a wafer in integrated circuit processing to prevent edge and backside coating on the wafer as well as providing a concentration gradient for the control gas to alter thickness uniformity.

In yet another embodiment the apparatus and method of the invention is applied to etching processes for controlling the uniformity of etching over a surface of a substrate etched.

The method and apparatus of the present invention is a simple alteration or addition to existing systems and solves a long-standing problem of controlling uniformity both in film application and removal. The invention also provides a way to control thickness to provide tailored profiles in deposition processes and to provide increased yield when etching substrates with non-uniform films.

BRIEF DESCRIPTION OF THE DRAWINGS

FIG. 7 is a partial section of a chuck supporting a wafer with a wafer seal ring and gas flow according to an embodiment of the present invention.

DESCRIPTION OF THE PREFERRED EMBODIMENTS

Figure 1:
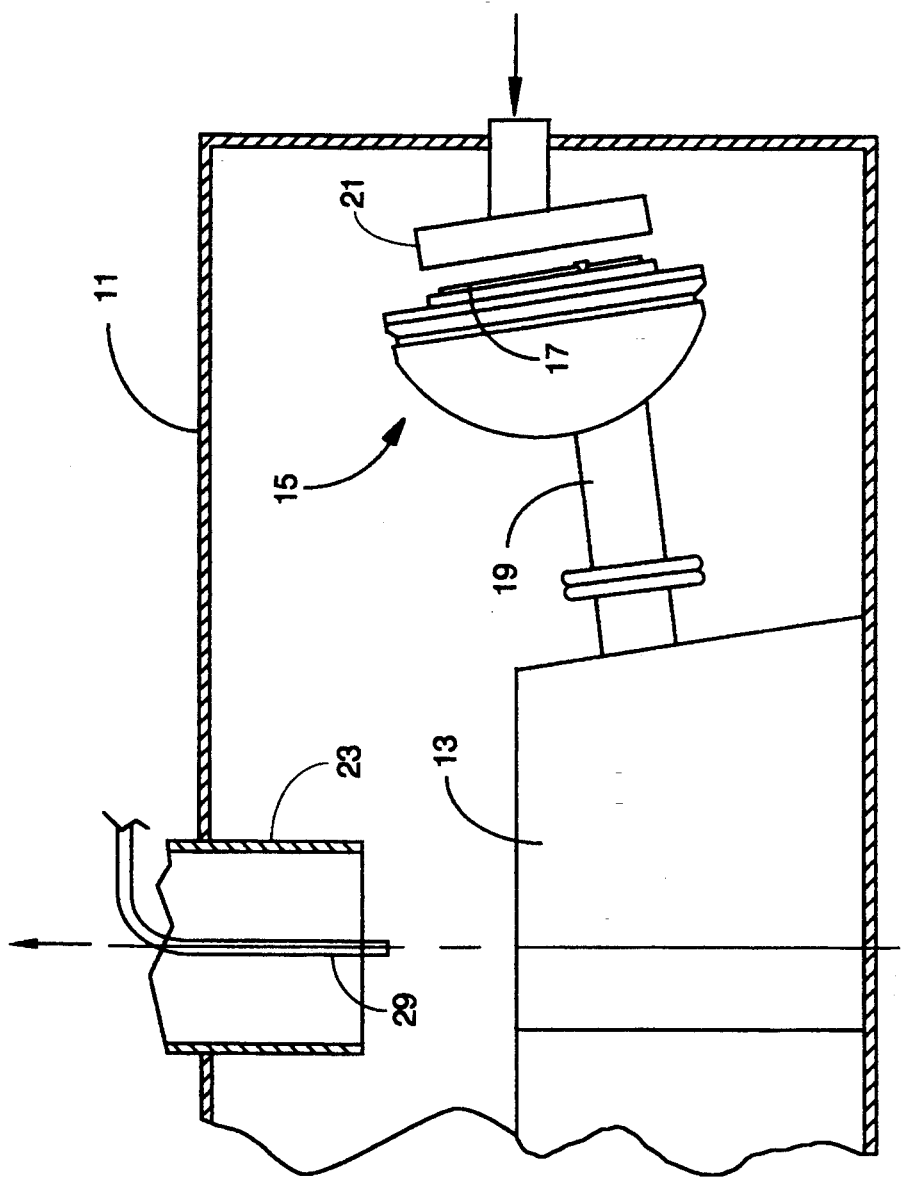
FIG. 1 is an elevation section view of a CVD system according to an embodiment of the invention.

FIG. 1 is an elevation view of elements within a CVD chamber 11 with a central turret 13 having wafer support chucks, such as chuck 15, attached. Chuck 15 supports a wafer 17 during processing, as do the other chucks not shown, and is heated by a resistance heater within the chuck connected to electrical power through an opening internal to channel 19. In a typical system six chucks are attached to the central turret radially, the turret is rotatable, and wafers are loaded and unloaded between process cycles through a vacuum load-lock chamber (not shown).

Process gases in the system of FIG. 1 are supplied to a wafer on a chuck through a distributor 21 called a "showerhead". The gases are mixed in a mixing chamber (not shown) before being injected through the showerhead, and openings in the showerhead are arranged in a pattern to provide the best possible uniformity of the resulting solid coating on the wafer. Gases impinge on the wafer surface, source gas is depleted, and carrier and process gases along with undepleted source gas move generally radially across the wafer surface, enter the process chamber away from the chucks, and are pumped from the chamber (in this example) through a vacuum pumping port 23 located above the turret in a central position. The central location of the pumping port helps to provide pressure and mass flow symmetry for gases flowing in the system.

In the example illustrated by FIG. 1, to describe an embodiment of the invention, a tungsten deposition process is performed. In this process, tungsten hexaflouride ($WF_6$) is mixed in a mixing chamber before being injected into the process chamber through the showerheads with hydrogen ($H_2$), Argon (A), and Nitrogen ($N_2$). Argon is used as a carrier gas, hydrogen is known to participate chemically in such a manner that the deposition rate depends to some degree on the presence and concentration of hydrogen, and nitrogen is known to participate in a manner that enhances the specularity of a deposited coating.

The chemical processes that occur in the reduction of $WF_6$ with hydrogen are dynamic and somewhat complex, so any simple statement of the chemistry is an approximation. Important to the present invention, however, is the empirically demonstrated phenomenon that the deposition rate of tungsten from the mixture is a function of hydrogen concentration, as well as other factors. Within a range of mixtures known to be useful for tungsten deposition with hydrogen reduction, the rate of tungsten deposition has been shown to be a function of the partial pressure of hydrogen to the ½ power. In other words:

$$R \approx (P_H)^{.5}$$

where R is the deposition rate and $P_H$ represents the partial pressure of hydrogen.

Figure 2B:
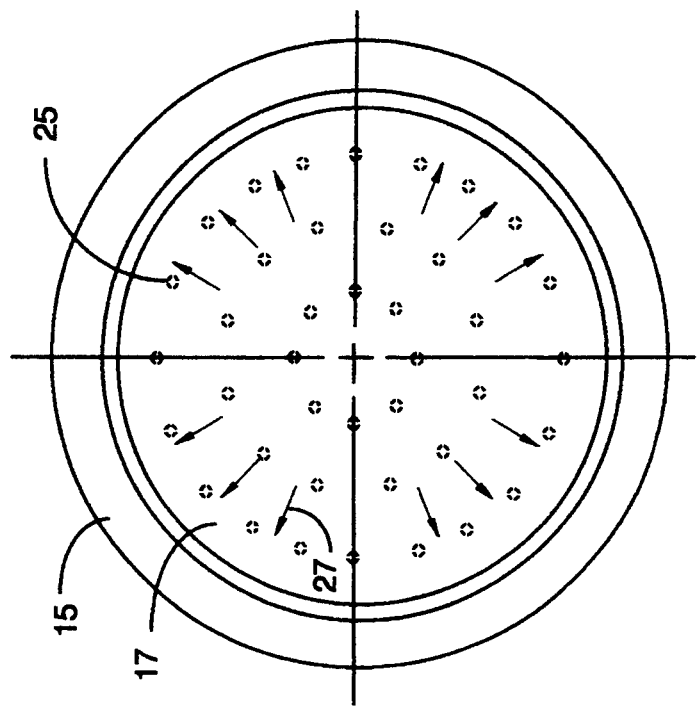
FIG. 2B is a view of part of the chuck in FIG. 2A taken from the vantage of line 2B—2B in FIG. 2A.
Figure 2A:
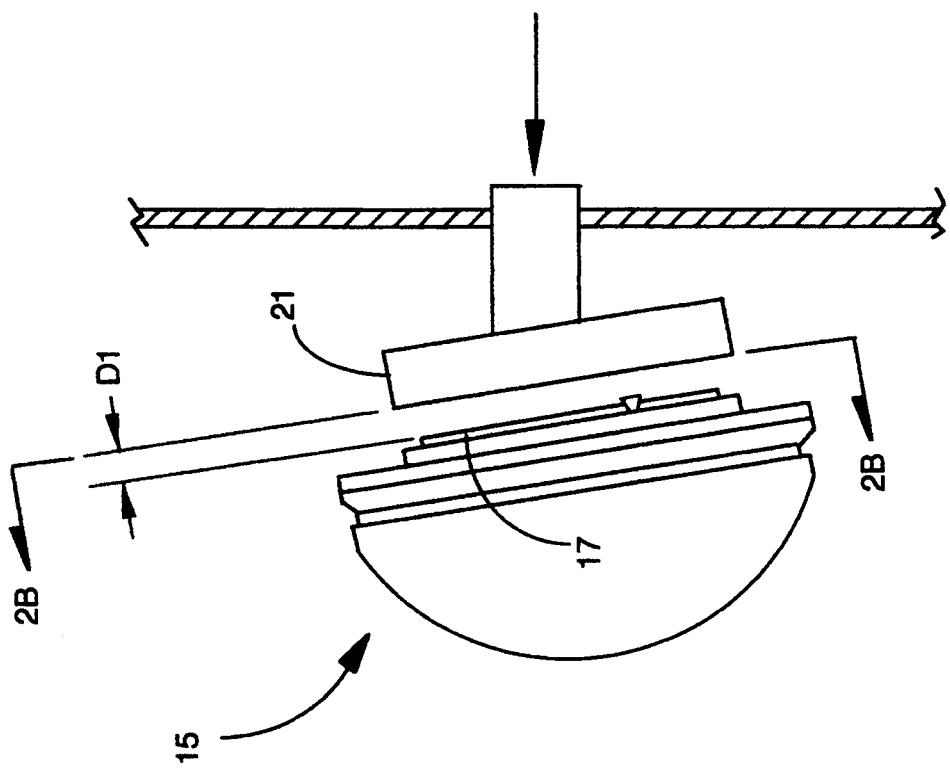
FIG. 2A is an elevation view of a single chuck for supporting a wafer during processing.

FIG. 2A is an enlarged view of chuck 15 supporting wafer 17 facing showerhead 21 with a distance D1 of about 12 mm. between the wafer surface to be coated and the surface of the showerhead where coating gas emerges. FIG. 2B is a view from the showerhead toward the wafer, taken from the vantage of line 2B—2B in the direction of the arrows.

In FIG. 2B, there is shown a pattern of openings in dotted outline arranged in circular arrays, such as opening 25. This pattern is representative of openings in the face of showerhead 21 for admitting the mixture of coating and carrier gases that are injected into the space between the showerhead and the wafer. The general path for coating gases is from an opening toward the wafer, then radially, as shown by radial arrows such as arrow 27 in FIG. 2B, until the gases pass from between the wafer and the showerhead into the larger volume of the chamber.

Generally, the number of openings and the placement in the face of the showerhead are determined empirically to best achieve uniformity. Still, until the present invention, it is common for coating thickness to degrade near the edge of the wafer.

Referring now back to FIG. 1, in an embodiment of the present invention, depositing tungsten by hydrogen reduction as described above, a second source of hydrogen with precise mass flow control is provided at the vacuum pumping port 23 through an inlet port 29. It has been found that hydrogen admitted at the vacuum port, although much of the influx will be pumped away along with the unused coating gas mixture, will back-diffuse into the chamber increasing the partial pressure of hydrogen marginally throughout the chamber, and that the increase is repeatable and controllable.

The reason pumping is done at the central location is to provide a symmetrical effect for gas pressure throughout the chamber. It is believed that the second source hydrogen effect on hydrogen partial pressure throughout the chamber is symmetrical for substantially the same reason. For example, the increase in partial pressure of hydrogen at a point just outside a wafer periphery on one chuck is substantially the same as the increase at the corresponding point at another chuck.

In addition to the symmetrical effect, the distance of the wafers on the chucks from the second source of hydrogen provides for the increase in partial pressure of hydrogen to be substantially the same at any point in a ring at the edge of a wafer on a chuck, and substantially the same from wafer to wafer. Moreover, the fact that most of the hydrogen is pumped away at the vacuum pumping port, and the fact that the general direction of gas flow is from the wafer positions (from the showerheads) toward the vacuum pumping port, provides for fine resolution in altering the partial pressure of hydrogen in the chamber at the wafer periphery. That is, a relatively large change in mass flow of hydrogen at hydrogen inlet port 29 results in a relatively small change in the partial pressure of hydrogen at the periphery of the wafer.

Figure 3:
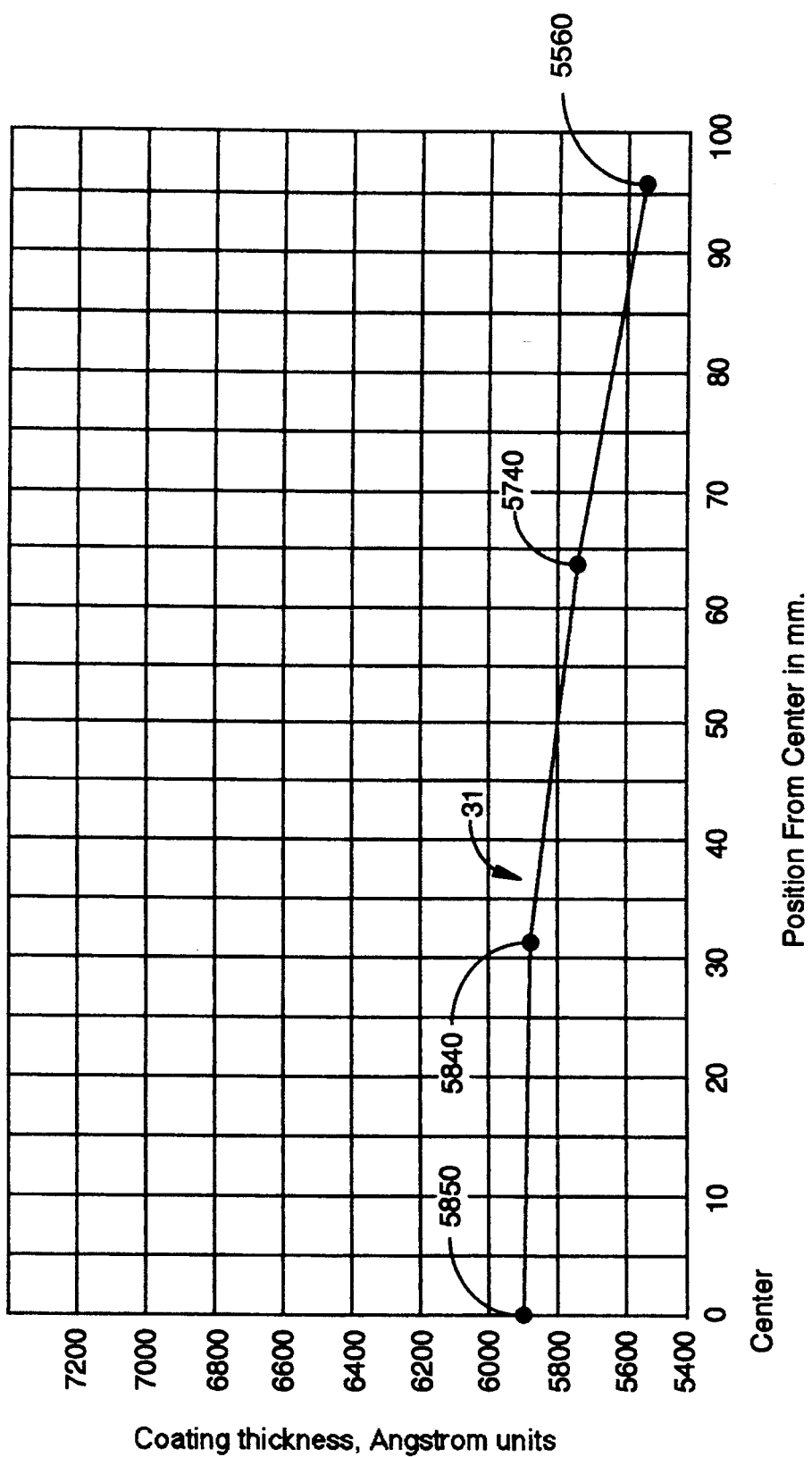
FIG. 3 is an example of a thickness uniformity profile for a wafer coated without benefit of the present invention.

FIG. 3 is a deposition profile 31 with coating thickness expressed in Angstrom units on a nominal 8 inch (200 mm.) wafer in a chamber with apparatus as described above with reference to FIGS. 1, 2A, and 2B. The process performed was hydrogen reduction of tungsten hexaflouride at a total pressure of 30 Torr, a chuck temperature of about 400 degrees C., and with a spacing from the showerhead to the wafer surface to be coated of about 2.5 cm. The radial position on the wafer is indicated on the x-axis in mm, and the thickness of the deposited material is related on the y-axis in Angstrom units. In this example, the wafer is 200 mm diameter, which is a nominal 8 inch wafer.

The maximum thickness is in the center of the wafer (0 mm. radial position) in this example, and the thickness falls rather rapidly at the edge, as has been described above, to a value of about 95% of maximum near the edge. The thickness of 5560 units was measured at about 95.25 mm. from center (3.75 inches).

This profile, particularly the phenomenon of rapid decrease of thickness at the edge, is typical of wafers coated in CVD processes without the benefit of the present invention. The degradation of thickness is about 5% from maximum in the example, and the deviation from a perfectly uniform thickness may therefore be said to be within plus or minus 2.5%. Also in the example shown by FIG. 3, although not explicit in the example, the profile is symmetrical about the center of the coated wafer. This is also typical, but may vary due to combinations of influences, such as the way coating gases are introduced into the vicinity of the wafer.

Figure 4:
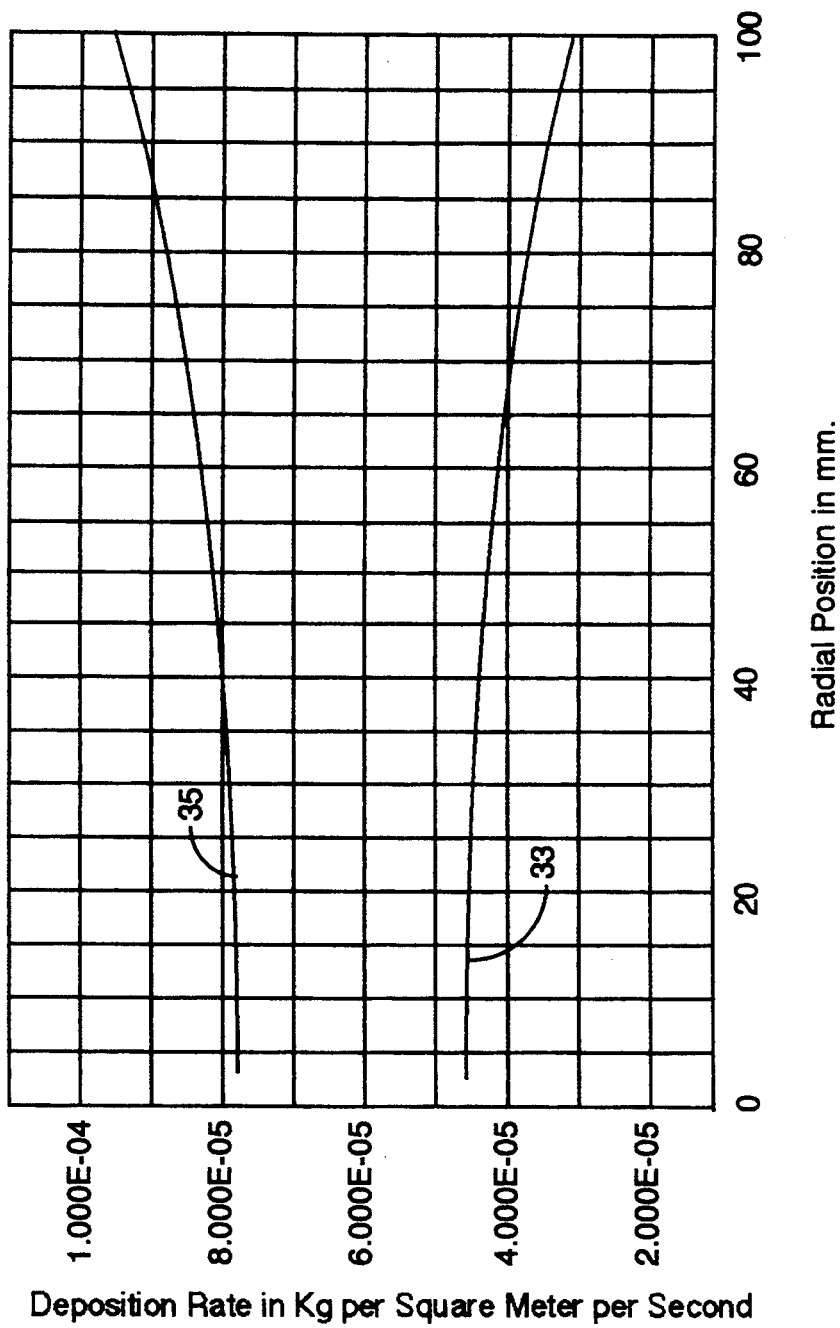
FIG. 4 is a simulation using fluid dynamic modeling of deposition rate over a wafer in a system according to the present invention.

FIG. 4 shows deposition rate determined by application of differential fluid dynamics modeling at various points on a wafer being coated with results plotted radially. Curve 33 shows how the simulated deposition rate changes radially without the second source of hydrogen, and with substantially the physical conditions used to obtain the empirical results of FIG. 3. There is a good correlation between the calculated profile of curve 33 and the empirical results of FIG. 3.

Curve 35 in FIG. 4 shows one instance of simulated deposition under the same circumstances as used for curve 33, but with hydrogen flowing from inlet 29 (FIG. 1). The deposition rate change relative to distance from center is reversed. Moreover, curve 35 may be altered by adjusting the flow of hydrogen from the second source.

Deterioration of deposition rate with increasing distance from the center of the wafer is believed to be due to a deteriorating hydrogen concentration radially. The shape of the hydrogen partial pressure gradient is thought to be due to a number of factors. For example, outside the volume between a wafer on a chuck and the associated showerhead device, there is little restriction to flow, and the area available for flow is quite broad. Within the volume between the showerhead and the wafer being coated, there is a net flow of process gases radially outward. That is, opposing the diffusion of hydrogen from the second source toward the center of any wafer. Another factor is that hydrogen is involved in the process chemistry, and is combined in intermediate products of the CVD reaction.

Figure 5:
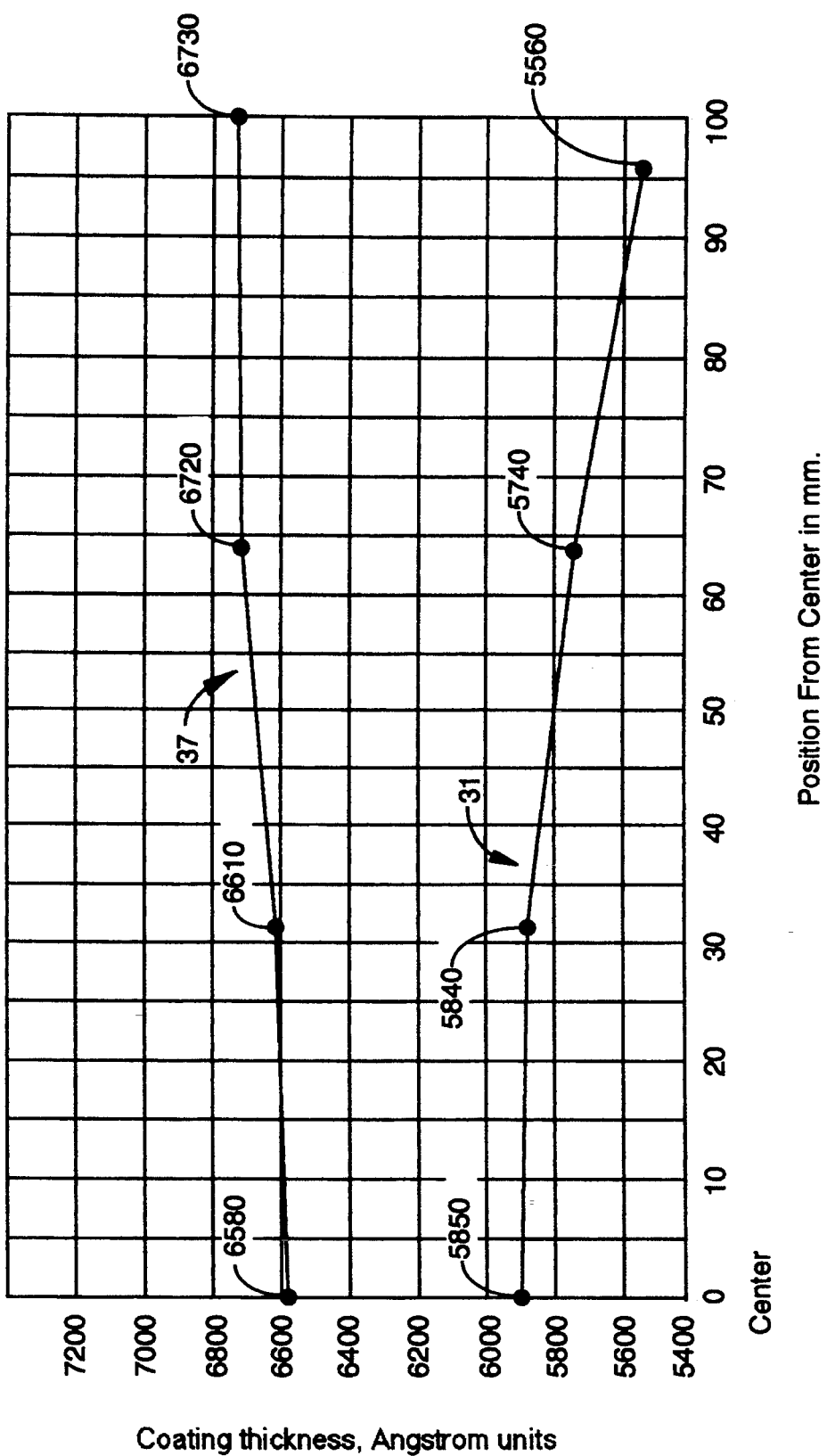
FIG. 5 is an example of a thickness uniformity profile for a wafer coated in the same manner as the wafer for which the profile of FIG. 3 is developed, except with the advantage of the pressure gradient provided by the present invention.

FIG. 5 is the thickness profile of FIG. 3 with a new thickness profile 37 plotted on the same coordinate system. Profile 37 was obtained with the same process parameters used for profile 31, except 12,000 sccm of hydrogen was flowed in the second-source inlet 29 (FIG. 1). Just as was observed with the simulation of deposition rate, the thickness profile gradient has been reversed, providing substantiation of the relationship illustrated in FIG. 4. In profile 37, using the second-source hydrogen, the maximum thickness is near the edge of the wafer, and the minimum at the center. The deviation from min to max is about 2.3%. By reducing the flow of hydrogen below 12,000 sccm, the profile may be adjusted to show very little deviation in thickness radially.

It has been found in experimental work that the uniformity profile can be effectively improved and controlled in the manner described above, to the extreme of causing the conventional profile to "reverse", then showing the maximum thickness at the wafer edge, as indicated above. Moreover, the technique is also effective for apparatus that does not use a showerhead for gas injection. In situations without a showerhead or other baffle parallel to the surface coated, the effect may be considerable different than that illustrated for the situation with a showerhead. Also, the effect is not limited to hydrogen from a second source, as in the current example, but works for any process in which the deposition rate is dependent on the partial pressure of one gaseous ingredient which may be introduced in a second source.

Figure 6B:
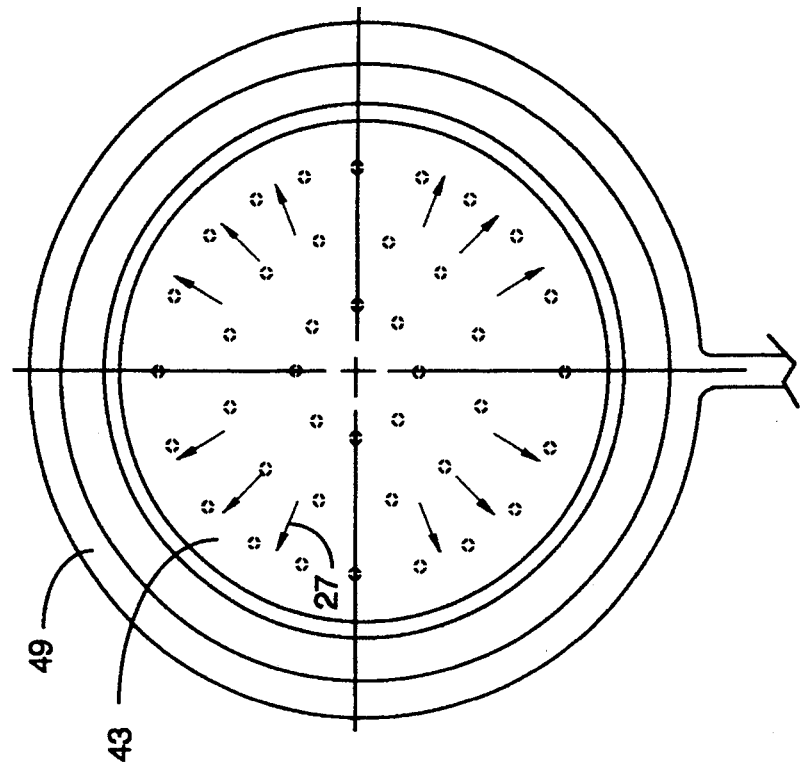
FIG. 6B is a face view of the chuck of FIG. 6A taken from the vantage of line 6B—6B of FIG. 6A.
Figure 6A:
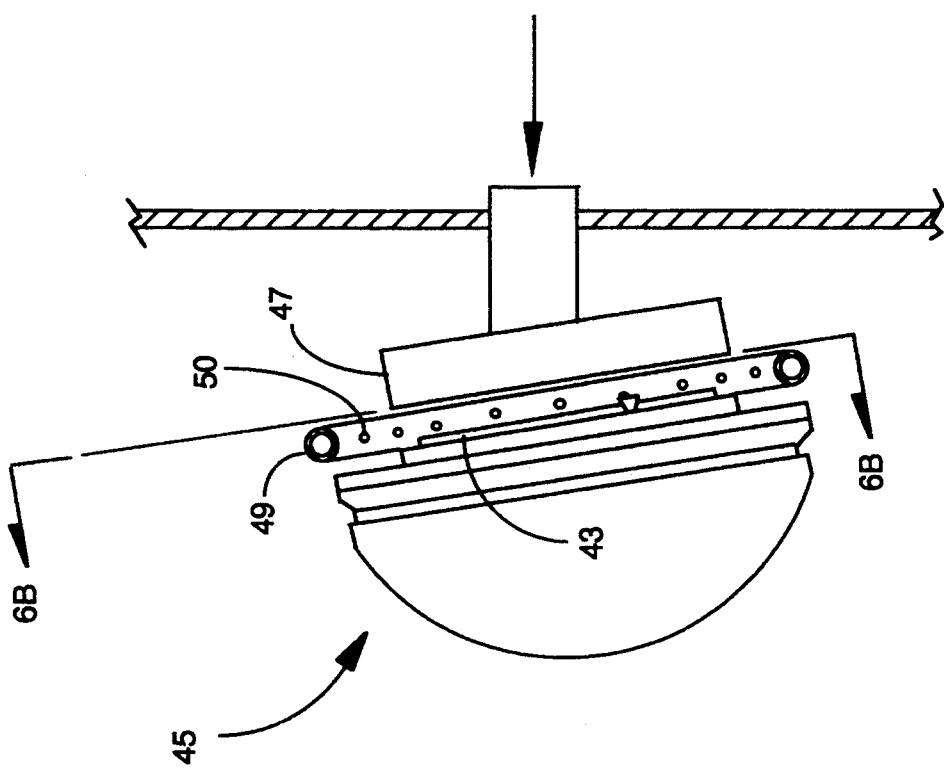
FIG. 6A is a side elevation view of a chuck having a second-source distribution manifold in an embodiment of the present invention.

FIGS. 6A and 6B show a wafer 43 on a chuck 45 with a showerhead device 47, similar to the system of FIGS. 2A and 2B, except in the system of FIGS. 6A and 6B there is no second source for hydrogen at the central vacuum pumping port as in FIG. 1. Rather, in the system of FIGS. 6A and 6B, supplemental (second source) hydrogen is fed through a manifold 49 substantially surrounding the wafer being coated, and injected from a plurality of holes, such as hole 50, in the manifold to provide a substantially equal flow relative to position around the periphery of the wafer.

It is known to the present inventors to use a wafer seal ring to hold a wafer in contact with a chuck surface, and to flow a purge gas from behind the wafer seal ring to prevent deposition on the edge and the backside of the wafer. The wafer seal ring may be implemented in a number of different ways relative to the wafer. Also, the purge gas may be any gas that is not reactive in the process, such as argon. FIG. 7 is a cross section of a chuck 51 with a wafer 53 held by a wafer seal ring 55 in a manner to provide a volume 57 around the wafer but behind the ring. The ring is designed to provide a slot 59 from volume 57 to the greater volume in the CVD chamber. To prevent coating gases from reaching the edge and backside of the wafer in process, purge gas is flowed into volume 57 through passages such as passage 61 shown through chuck 51, and flows radially outward through slot 59, opposing intrusion of coating gas into volume 57.

In the present invention, hydrogen, in the example of hydrogen reduction of tungsten hexaflouride, is flowed into volume 57 rather than, or mixed with, another purge gas such as argon. The effect is similar to the second source introduction of hydrogen through a ring manifold, as shown in FIGS. 6A and 6B, and the hydrogen (or mixture) still fulfills the function of excluding coating gases from the edge and backside of the wafer. In FIG. 7, coating gas mixture is introduced through a showerhead device 63.

The arrangement of the wafer seal ring and slot shown in FIG. 7 is but one way a seal ring may be used in conjunction with backside gas and a second source for hydrogen or other gas effective to control deposition rate. It is also known to have the seal ring contact the chuck rather than the wafer with the slot at the wafer periphery, in which case the wafer may be held on the chuck by differential pressure, using one or more vacuum passages opening behind the wafer. It is known, too, to have a slot both at the wafer and at the chuck. There are other embodiments, and all are effective as long as there is an opening, such as the slot shown, for introducing the effective gas substantially equally around the periphery of the wafer.

The embodiments described in examples herein, utilizing a second source of hydrogen in a process reducing tungsten hexaflouride by hydrogen to produce a tungsten film, is but one process for which the present invention is useful. As mentioned above, there are other CVD processes wherein the deposition rate of the solid film is dependent to some degree on one or more gaseous ingredients, such as silane reduction of tungsten hexaflouride. The method and apparatus of the invention is useful for controlling uniformity in any such process.

Application In Etching Processes

In all of the embodiments described above, the present invention has been applied to apparatus and processes for chemical vapor deposition to form solid films. The process is also applicable in etching processes, where the purpose is to remove selected portions of a previously formed film.

Figure 8:
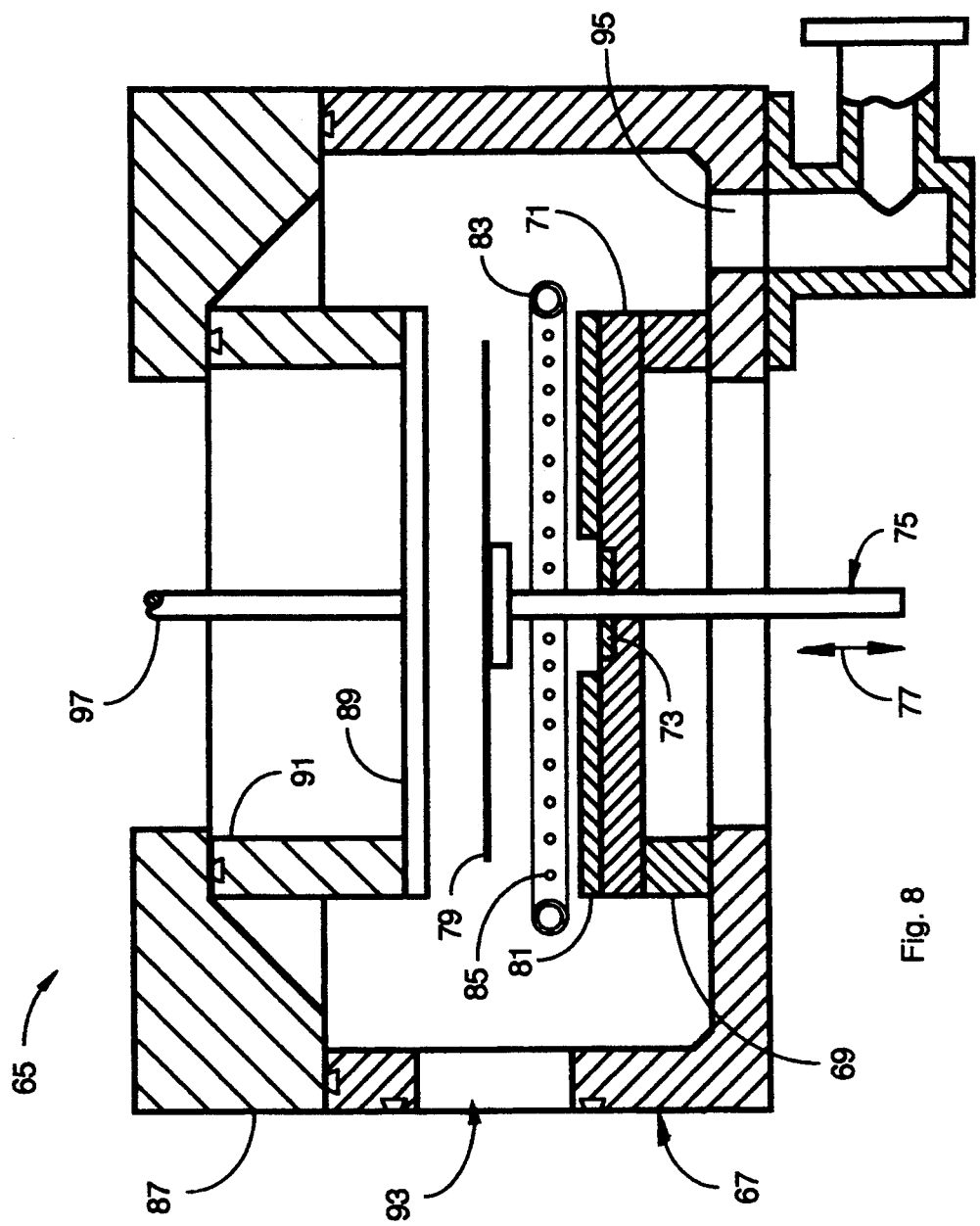
FIG. 8 is a cross-section elevation view of a system for plasma etching substrates in an embodiment of the present invention.

FIG. 8 is a cross-section elevation view of a system known in the art as a parallel-plate reactor, for accomplishing etching of film on a wafer as a step in integrated circuit manufacture. A process typically performed in such a reactor is reactive ion etch (RIE), wherein a gas mixture is inlet to the chamber and a plasma is formed in a manner that species reactive with the material to be etched are formed as ions, and accelerated to the film surface as a result of electrical bias.

In the system of FIG. 8, a lower chamber portion 67 supports an insulating ring 69 which in turn supports a first pedestal portion 71 having a linear dynamic seal 73 for allowing an elevator device 75 to be raised and lowered (arrow 77) a limited amount as an aid in loading and unloading a wafer 79, supported on elevator 75.

A second pedestal portion 81 is supported by pedestal portion 71.

An upper chamber portion 87 is sealed to portion 67, forming a vacuum-tight enclosure. An upper plate electrode 89 is mounted on an insulating ring 91 sealed to the upper chamber portion. The chamber has an opening 93 for loading and unloading wafers, and in an embodiment opening 93 leads to an air lock through a valve. The chamber also has openings such as opening 95 leading to a vacuum pumping system, (not shown), for evacuating the chamber and pumping away unused process gases and product gases during processing.

A robotic transfer apparatus (not shown) is utilized to transfer an unprocessed wafer through opening 93 and to place it on pedestal 75, as wafer 79 is shown supported in FIG. 8. The robotic arm retracts through opening 93, which is then sealed, and pedestal 75 lowers the wafer to rest on pedestal portion 81. It is important to the discussion to remember that the wafer is processed while resting on portion 81. Typically opening 93 leads to an evacuated load-lock chamber, so the process chamber may be maintained under a vacuum during transfer by way of openings 95.

In process, pedestal portion 81 may be electrically connected to a terminal of an alternating current power supply, and electrode 89 connected to the opposite terminal. An etchant gas mixture is admitted through an inlet 97 and flows over the wafer to be etched. When the power supply to which the electrodes are connected is activated, a plasma is struck, and the surface of the wafer is etched via bombardment by active etchant ions. A useful article that discusses plasma etching is "Plasma Etching Methods for the Formation of Planarized Tungsten Plugs Used in Multi-Level VLSI Metallizations", by R. J. Saia et al., in the *Journal of the Electrochemical Society*, April 1988.

A desirable condition during etching is often that the etch be performed at an even rate over the entire surface of the wafer. This is analagous to the need for even coating in CVD coating apparatus as discussed above. Just as in the coating processes, unevenness is a common problem in etching.

The present invention is applied in this case by introducing a control gas that affects the etch rate in a manner that a partial pressure gradient of the control gas is provided radially relative to the wafer surface. For example, in a case wherein, without a control gas, etching is observed to occur at a higher rate near the periphery of a wafer, a control gas that has the effect of relatively inhibiting etch rate may be introduced from a manifold ring 83 generally surrounding the wafer supported on pedestal portion 81, through substantially equally-spaced holes 85.

In this instance the control gas may be a non-reactive gas, such as argon, as the etch rate for an active species is known to be less when diluted by an inactive species. By introducing the inactive gas from manifold 85 around the periphery of the wafer, a partial pressure gradient is set up radially relative to the wafer, and the etch rate radially may be controlled. The relative effect may be controlled by varying the flow of the control gas.

In a process where etching may occur without control gas at a relatively lower rate near the edge of a wafer than the center, for example, the inlet gas mixture could be mixed with a diluting non-reactive gas, and a reactive species could be introduced via manifold 83.

This would produce a relatively higher etch rate near the periphery.

There are many other choices where control gas may be inlet to have the desired effect, either increasing or decreasing etch rate, by establishing a partial pressure gradient relative to the surface of the wafer.

It will be apparent to one with skill in the art that there are many changes that might be made in detail without departing from the spirit and scope of the invention. For example, the apparatus and method is effective for any process in which the rate of the reaction is dependent on one or more gaseous ingredients which may be introduced in a second source in addition to being mixed with the source gases injected into the chamber. The invention would be effective if the controlling gas, such as hydrogen in one of the examples used, were to be introduced only at the central location or around the wafer, rather than being mixed with the source gas. Preferably, however, the second source is in addition to the content of the control gas in the injected mixture. The control has more resolution in this method.

There are many ways the second source may be accomplished, such as the central injection shown and the injection through a ring manifold or from behind a wafer seal ring as shown above. It is preferable that the control gas, such as hydrogen, be injected in a manner that creates a uniform partial pressure around the periphery of the wafer, and creates a radial gradient decreasing toward the center of the wafer. There are, however, conceivable situations where it might be desirable to create and control uneven thickness distributions on a wafer, and such situations could be managed and controlled by the teachings of the present invention.

In addition to a broad range of ways the second source may be accomplished, there are similarly many changes that may be made in materials, manifolding, system arrangement, number of chucks in a system, and so forth, without departing from the spirit and scope of the invention.

What is claimed is:

1. A system for providing a film of a material on a surface of a substrate by a CVD process performed in a CVD chamber, comprising:
   a plurality of supports within the CVD chamber for supporting one or more substrates during processing, the supports arranged substantially equidistant radially around a central axis of the CVD chamber;
   heaters associated with the supports for heating the substrate to facilitate deposition of the film;
   at leas one injector for providing coating gas into the CVD chamber, the coating gas comprising at least one substance reactive to produce the film of material; and
   a control gas injector positioned at a point substantially on the central axis, for injecting a control gas into the CVD chamber, providing a concentration gradient of the control gas proximate and substantially parallel to the surface to be coated on the substrate, the deposition rate of the material forming the film in the CVD process being a function of the concentration of said control gas in said CVD process.

2. A system as in claim 1 comprising plural coating gas injectors located at least one at each substrate support.

3. A system as in claim 2 wherein the coating gas injectors comprise, at each support, multiple injection passages toward the substrate support arranged in a pattern through a surface proximate and substantially parallel to the support.

4. A system as in claim 1 wherein the CVD process comprises reduction of tungsten hexafluoride, and the control gas injected at a point substantially on the central axis is hydrogen.

5. A system as in claim 1 wherein the CVD process comprises reduction of tungsten hexafluoride, and the control gas injected at a point substantially on the central axis is silane (SiH$_4$).

6. A system as in claim 4 wherein the solid film formed is tungsten.

7. A system as in claim 5 wherein the solid film formed is tungsten silicide.

8. A system as in claim 1 wherein the plurality of supports are arranged around and mounted to a rotatable central turret within the CVD chamber, the system further comprising at least one load lock for handling substrates into and out of the CVD chamber without exposing the interior of the chamber to atmospheric conditions.

9. The system of claim 5 further comprising robotic transfer apparatus for loading and unloading substrates.

* * * * *